(12) United States Patent
Akiyama et al.

(10) Patent No.: US 9,704,925 B2
(45) Date of Patent: Jul. 11, 2017

(54) EL DISPLAY DEVICE

(71) Applicant: JOLED INC., Tokyo (JP)

(72) Inventors: Toshiyuki Akiyama, Tokyo (JP);
Hiroyuki Ajiki, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/771,577

(22) PCT Filed: Aug. 20, 2013

(86) PCT No.: PCT/JP2013/004909
§ 371 (c)(1),
(2) Date: Aug. 31, 2015

(87) PCT Pub. No.: WO2014/136150
PCT Pub. Date: Sep. 12, 2014

(65) Prior Publication Data
US 2016/0005798 A1    Jan. 7, 2016

(30) Foreign Application Priority Data

Mar. 4, 2013   (JP) .................................. 2013-041517

(51) Int. Cl.
*H01L 27/14*    (2006.01)
*H01L 21/00*    (2006.01)
(Continued)

(52) U.S. Cl.
CPC ...... *H01L 27/3211* (2013.01); *H01L 27/3246* (2013.01); *H01L 51/5012* (2013.01);
(Continued)

(58) Field of Classification Search
CPC ............. H01L 51/5012; H01L 51/5056; H01L 27/3211; H01L 27/3246; H01L 2251/558
See application file for complete search history.

(56) References Cited

U.S. PATENT DOCUMENTS 8,203,158 B2    6/2012   Yoshida et al.
8,492,184 B2    7/2013   Nishiyama et al.
(Continued)

FOREIGN PATENT DOCUMENTS

JP    2007-035347    2/2007
JP    2009-054608    3/2009
(Continued)

OTHER PUBLICATIONS

International Search Report (ISR) from International Searching Authority (Japan Patent Office) in International Pat. Appl. No. PCT/JP2013/004909, dated Sep. 24, 2013.
(Continued)

*Primary Examiner* — Julio J Maldonado
*Assistant Examiner* — Moin Rahman
(74) *Attorney, Agent, or Firm* — Greenblum & Bernstein, P.L.C.

(57) ABSTRACT

An EL display device including a light emitter configured to emit at least red, green, and blue light; and a thin film transistor array that controls light emission. The light emitter includes light-emitting layers within areas defined by a bank that emit at least red, green, and blue light. The light emitter further includes electrodes that extend under the bank and hole transport layers that are above the electrodes within the areas defined by the bank, the light-emitting layers being formed on the hole transport layers. The hole transport layers each have a main portion and a peripheral protrusion in contact with a side surface of the bank that protrudes upwards from the main portion. The light-emitting layers each have a peripheral protrusion in contact with a side surface of the bank, formed above a corresponding one of the peripheral protrusions.

1 Claim, 2 Drawing Sheets

(51) Int. Cl.
*H01L 27/32* (2006.01)
*H01L 51/50* (2006.01)

(52) U.S. Cl.
CPC ...... *H01L 51/5036* (2013.01); *H01L 51/5056* (2013.01); *H01L 2251/558* (2013.01)

(56) References Cited

U.S. PATENT DOCUMENTS

| | | |
|---|---|---|
| 8,492,754 B2 | 7/2013 | Nishiyama et al. |
| 8,981,361 B2 | 3/2015 | Ohuchi et al. |
| 9,012,897 B2 | 4/2015 | Harada et al. |
| 9,130,187 B2 | 9/2015 | Nishiyama et al. |
| 2007/0138943 A1* | 6/2007 | Tano ................ H01L 27/3246 313/503 |
| 2009/0284820 A1 | 11/2009 | Ejima et al. |
| 2010/0171415 A1 | 7/2010 | Akamatsu et al. |
| 2010/0231122 A1 | 9/2010 | Ishida |
| 2010/0327297 A1* | 12/2010 | Yoshida ............ H01L 27/3211 257/89 |
| 2011/0127907 A1 | 6/2011 | Ishida |
| 2011/0193107 A1* | 8/2011 | Takeuchi ............ H01L 27/3246 257/88 |
| 2012/0175603 A1 | 7/2012 | Takeuchi |
| 2013/0234121 A1* | 9/2013 | Sonoyama .......... H01L 51/5012 257/40 |

FOREIGN PATENT DOCUMENTS

| | | |
|---|---|---|
| JP | 2009-302042 | 12/2009 |
| JP | 2010-080268 | 4/2010 |
| JP | 2010-118509 | 5/2010 |
| JP | 2011-060518 | 3/2011 |
| JP | 2011-249089 | 12/2011 |
| WO | 2007/113935 | 10/2007 |
| WO | 2011/138816 | 11/2011 |

OTHER PUBLICATIONS

Office Action from Japan Patent Office (JPO) in Japanese Patent Appl. No. 2015-504002, dated Aug. 9, 2016.

\* cited by examiner

EL DISPLAY DEVICE

TECHNICAL FIELD

The present technology is related to electroluminescence (EL) display devices.

BACKGROUND ART

Recently, next generation display devices are being actively developed, and EL display devices that have a first electrode, a plurality of organic layers including a light-emitting layer, and a second electrode layered in order on a driving substrate are attracting attention. EL display devices have features such as self-generated light emission and therefore a wide viewing angle, no backlight requirement and therefore low power consumption, high responsiveness, and properties that enable reduced device thickness. Thus, application of EL display devices to large screen display devices such as televisions is strongly desired.

For color displays, red, blue, and green three-color pixel displays are most typical, but with the aims of improved power saving and reliability, red, blue, green, and white four-color pixel displays and red, blue, green, and pale blue four-color pixel displays are being developed by various companies.

In an organic EL light-emitting element it is necessary to form an organic EL light emitter for each pixel, such as a red, blue, and green three-color organic EL light emitter or a red, blue, green, and white four-color organic EL light emitter.

The most typical manufacturing process for manufacturing individual organic EL units is by using vapor deposition into minute holes in a fine metal mask. For example, an organic EL unit emitting red light is formed by vapor deposition using a fine metal mask for red, an organic EL unit emitting green light is formed by vapor deposition using a fine metal mask for green, and an organic EL unit emitting blue light is formed by vapor deposition using a fine metal mask for blue, thereby forming a red, green, and blue light-emitter.

However, to form large organic EL light-emitting elements and reduce costs, development of organic EL light-emitting element technology using large substrates is of importance.

Recently, two methods of forming organic EL light-emitting elements using large substrates are attracting attention.

A first method is a method of forming white organic EL elements in all display areas and achieving a color display by using a red, green, blue, and white four-color color filter. This method is effective in forming large screens and high-definition displays.

Another method is a coating method of forming organic EL light emitters. As coating methods, various manufacturing methods have been considered. They can be roughly classified into: methods using relief printing, flexographic printing, screen printing, gravure printing, etc.; and methods using inkjet printing (see Patent Literature 1).

CITATION LIST

Patent Literature

Patent Literature 1: Japanese Patent Application Publication 2011-249089

SUMMARY OF INVENTION

An EL display device according to the present technology includes a light emitter configured to emit at least red, green, and blue light; and a thin film transistor array configured to control light emission of the light emitter. The light emitter includes light-emitting layers configured to emit at least red, green, and blue light, the light-emitting layers being disposed within areas defined by a bank. The light emitter further includes electrodes that extend under the bank and hole transport layers that are above the electrodes and within the areas defined by the bank, the light-emitting layers being formed on the hole transport layers. The hole transport layers each have a peripheral protrusion in contact with a side surface of the bank and a main portion, the peripheral protrusion protruding upwards from the main portion. The light-emitting layers each have a peripheral protrusion in contact with a side surface of the bank, the peripheral protrusions of the light-emitting layers being formed above corresponding ones of the peripheral protrusions of the hole transport layers.

According to the present technology, an inkjet method can be applied to manufacture of a large screen EL display device and variation in luminance efficiency of each sub-pixel is suppressed, achieving an EL display device that allows high definition.

EMBODIMENTS

Figure 1:
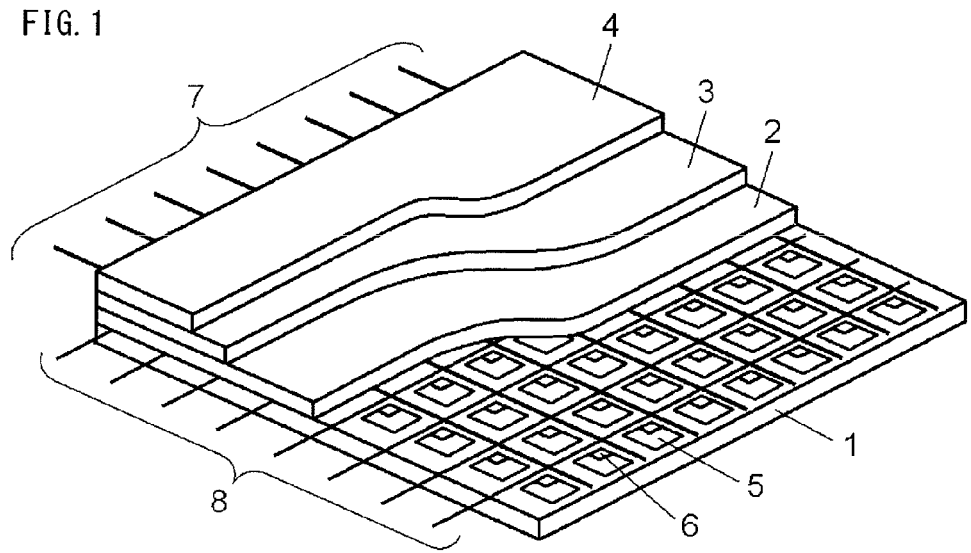
FIG. 1 is a perspective view of an organic EL display device according to one embodiment of the present technology.

The following is a description of a method of manufacturing an EL display device according to one embodiment of the present technology, with reference to FIGS. 1-4.

However, detailed description over and above what is necessary may be omitted. For example, detailed description of well-known matters and overlapping explanation of substantially identical configurations may be omitted. This avoids unnecessary redundancy in description and aids understanding for a person having ordinary skill in the art.

The inventors have provided drawings and the following description so that a person having ordinary skill in the art may sufficiently understand the present technology, but the drawing and the following description are not intended to limit the subject matter described in the claims.

Figure 2:
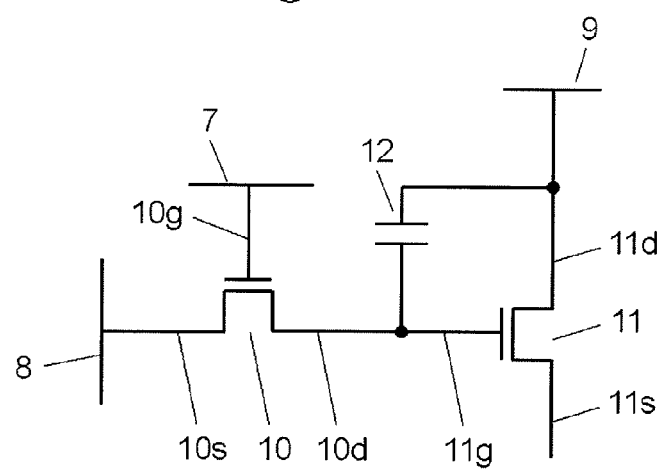
FIG. 2 is an electrical schematic illustrating configuration of a pixel circuit.

FIG. 1 is a perspective view illustrating a schematic configuration of the EL display device, and FIG. 2 is a diagram illustrating a circuit configuration of a pixel circuit that drives a pixel.

FIG. 1 and FIG. 2 relate to the EL display device, the EL display device including a thin film transistor array 1 and a light emitter. The light emitter is composed of layers of an anode 2 that is a bottom electrode, a light-emitting layer 3 composed of organic material, and a cathode 4 that is a light-transmissive upper electrode. Light emission of the light emitter is controlled by the thin film transistor array 1. The light emitter has a structure such that the light-emitting layer 3 is disposed between the anode 2 and the cathode 4, which are a pair of electrodes. A hole transport layer is formed between the anode 2 and the light-emitting layer 3, and an electron transport layer is formed between the light-emitting layer 3 and the cathode 4. A plurality of pixels 5 is arranged in a matrix in the thin film transistor array 1.

Each of the pixels 5 is driven by a corresponding one of pixel circuits 6. The thin film transistor array 1 includes a plurality of gate lines 7 arranged in rows, a plurality of source lines 8 as signal lines arranged in columns perpendicular to the gate lines 7, and a plurality of power supply lines 9 that extend parallel to the source lines 8 (not illustrated in FIG. 1).

Each row of the gate lines 7 is connected to gate electrodes 10g of thin film transistors 10 that operate as switching elements in the pixel circuits 6, the switching elements being provided to the pixel circuits 6 on a one-to-one basis. Each column of the source lines 8 is connected to source electrodes 10s of the thin film transistors 10 that operate as switching elements in the pixel circuits 6, the switching elements being provided to the pixel circuits 6 on a one-to-one basis. Each row of the power supply lines 9 is connected to drain electrodes 11d of thin film transistors 11 that operate as drive elements in the pixel circuits 6, the drive elements being provided to the pixel circuits 6 on a one-to-one basis.

As illustrated in FIG. 2, a given one of the pixel circuits 6 includes one of the thin film transistors 10 that operate as switching elements, one of the thin film transistors 11 that operate as drive elements, and one of capacitors 12 that store data to be displayed at corresponding pixels.

The one of the thin film transistors 10 includes: one of the gate electrodes 10g connected to one of the gate lines 7; one of the source electrodes 10s connected to one of the source lines 8; one of the drain electrodes 10d connected to one of the capacitors 12 and one of the gate electrodes 11g of one of the thin film transistors 11; and a semiconductor film (not illustrated). When voltage is applied to the one of the gate lines 7 and the one of the source lines 8 connected to the one of the thin film transistors 10, a voltage value applied to the one of the source lines 8 is stored as display data in the one of the capacitors 12.

The one of the thin film transistors 11 includes: the one of the gate electrodes 11g connected to the one of the drain electrodes 10d of the one of the thin film transistors 10; one of the drain electrodes 11d connected to one of the power supply lines 9 and the one of the capacitors 12; one of the source electrodes 11s connected to the anode 2; and a semiconductor film (not illustrated). The one of the thin film transistors 11 supplies, to the anode 2, a current corresponding to the voltage value stored by the one of the capacitors 12, from the one of the power supply lines 9, via the one of the source electrodes 11s. In other words, the EL display device having the above configuration adopts an active matrix scheme performing display control for each of the pixels 5 positioned at intersections of the gate lines 7 and the source lines 8.

In the EL display device, a light emitter emitting at least red, green, and blue light is formed from pixels having at least red (R), green (G), and blue (B) light-emitting layers, the pixels being arranged in a matrix. Each pixel is separated from other pixels by a bank. The bank is formed so that ridges of the bank extending parallel to the gate lines 7 and ridges of the bank extending parallel to the source lines 8 intersect with each other. Thus, pixels having RGB light-emitting layers are formed in portions surrounded by these ridges, i.e. openings of the bank.

Figure 3:
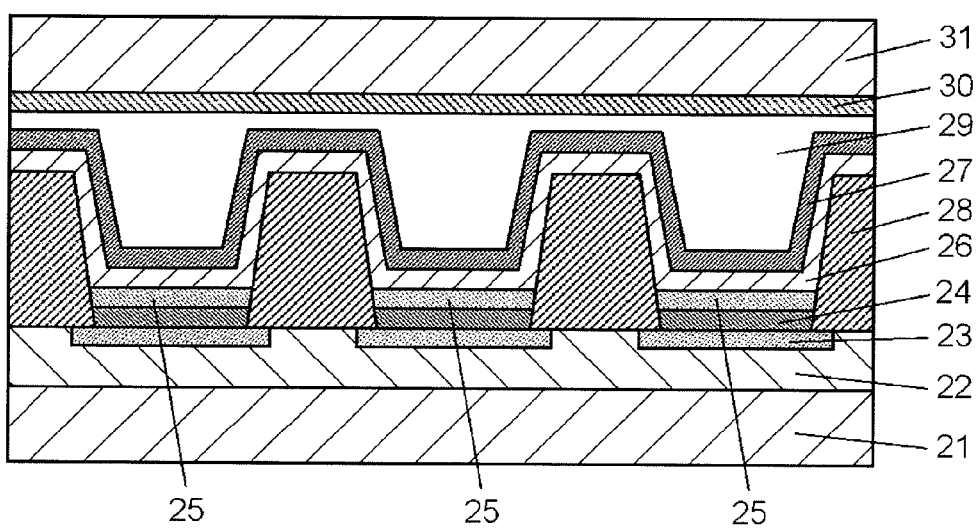
FIG. 3 is a cross-section illustrating configuration of RGB pixel portions in an EL display device.

FIG. 3 is a cross-section illustrating configuration of RGB pixel portions in an EL display device. As illustrated in FIG. 3, in the EL display device, the thin film transistor array 22 comprising the pixel circuits 6 described above is formed on a base substrate 21 such as a glass substrate or a flexible resin substrate. Further, the anode 23, which is a bottom electrode, is formed on the thin film transistor array 22 with a planarized insulating film (not illustrated) therebetween. The hole transport layer 24, the light-emitting layer 25 composed of organic material and emitting red, green, and blue light, the electron transport layer 26, and the cathode 27 that is a light-transmissive upper electrode are layered on the anode 23, thus forming an RGB organic EL light emitter.

The light-emitting layer 25 of the light emitter is formed in areas divided up by the bank 28, which is an insulating layer. The bank 28 is for dividing up light emission areas into predefined shapes while maintaining insulation between the anode 23 and the cathode 27, and is formed from, for example, a photosensitive resin such as silicon oxide or polyimide.

In the embodiment above, only the hole transport layer 24 and the electron transport layer 26 are illustrated, but a hole injection layer and an electron injection layer are layered on the hole transport layer 24 and the electron transport layer 26, respectively.

A light emitter configured in this way is covered by a sealing layer 29 such as silicon nitride and further sealed by a sealing substrate 31 such as a light-transmissive glass substrate or light-transmissive flexible resin substrate adhered over a whole surface, with an adhesive layer 30 between the sealing layer 29 and the sealing substrate 31.

Shape, material, size, etc., of the base substrate 21 is not specifically limited, and appropriate selection may be made according to purpose. For example, the base substrate 21 may be a glass material such as alkali-free glass or soda glass, a silicon substrate, or a metal substrate. Further, a polymer-based material may be used for purposes of weight reduction and flexibility. As a polymer-based material, polyethylene terephthalate, polycarbonate, polyethylene naphthalate, polyimide, polyimide, etc., is suitable, but other known polymer substrate material may be used such as other acetate resins, acrylic resins, polyethylene, polypropylene, and polyvinyl chloride resin. When a polymer-based material is used as a substrate, a method of manufacturing is used whereby, after a polymer substrate is coated, adhered, etc., on a material having stiffness such as glass, the organic EL light-emitting element is formed, and subsequently the material having stiffness such as glass is removed.

The anode 23 is formed from a metal material having high electrical conductivity such as aluminium, an aluminium alloy, or copper; a metal oxide having high electrical conductivity such as light-transmissive IZO, ITO, tin oxide, indium oxide, or zinc oxide; a metal sulfide; etc. As a method of film formation, methods of forming thin films may be used, such as vacuum deposition, sputtering and ion plating.

For the hole transport layer 24, a phthalocyanine compound such as poly(vinylcarbazole)-based material, polysilane-based material, a polysiloxane derivative, copper phthalocyanine, etc.; an aromatic amine compound; etc., is used to perform the work of charge transport. As a method of film formation, various coating methods are suitable, forming a layer having a thickness of approximately 10 nm to 200 nm. The hole-injection layer layered on the hole transport layer 24 is a layer for increasing hole injection from the anode 23, and is formed by sputtering of a metal oxide such as molybdenum oxide, vanadium oxide, aluminium oxide, etc.; a metal nitride; or a metal oxide nitride.

The light-emitting layer 25 is mainly composed of an organic material that emits light, such as fluorescent or phosphorescent light, properties of which may be improved by adding a dopant as required. As a polymer-based organic material suitable for printing, a poly(vinylcarbazole) derivative, a poly(p-phenylene) derivative, a polyfluorene derivative, a polyphenylenevinylene derivative, etc., is used. A dopant is a material used for shifting a wavelength of emitted light and improving light-emitting efficiency, and many dye-based and metal complex-based dopants have been developed. When the light-emitting layer 25 is formed on a large substrate, a printing method is suitable. Among various printing methods, an inkjet method is used and the light-emitting layer 25 having a thickness of approximately 20 nm to 200 nm is formed.

For the electron transport layer 26, a material is used such as a benzoquinone derivative, a polyquinoline derivative, or an oxadiazole derivative. As a method of film formation, vacuum deposition or a coating method is used, the electron transport layer 26 typically having a thickness of approximately 10 nm to 200 nm. The electron injection layer is formed using vacuum deposition or a coating method using a material such as barium, phthalocyanine, lithium fluoride, etc.

The cathode 27 is a different material depending on a direction in which light is extracted. When light is extracted from a cathode 27 side, a light-transmissive electrically-conductive material is used such as ITO, IZO, tin oxide, zinc oxide, etc. When light is extracted from an anode 23 side, a material is used such as platinum, gold, silver, copper, tungsten, aluminium, aluminium alloy, etc. As a method of film formation, sputtering or vacuum deposition is used, the cathode 27 typically having a thickness of approximately 50 nm to 500 nm.

The bank 28 is a structure required to fill areas with a sufficient amount of a solution containing material of the light-emitting layer 25, and is formed into a predefined shape by photolithography. According to the shape of the bank 28, shapes of sub-pixels of an organic EL light-emitter can be controlled.

However, in the organic EL light emitter, light emission efficiency of each sub-pixel is greatly changed by variation of thickness of the light-emitting layer 25. A drive method of applying correction to current applied to each sub-pixel has been used with respect to this variation in light emission efficiency of each sub-pixel, but the current state of the art does not sufficiently improve variation in light emission efficiency of each of the sub-pixels in the organic EL light emitter.

When the inventors studied this problem, they found that when film thickness of the light-emitting layer 25 is thin at a portion in contact with the bank 28, excess current flows through the portion. Furthermore, light extraction efficiency of thin portions of the light-emitting layer 25 is poor, and therefore a sub-pixel in which film thickness of the light-emitting layer 25 is thin at the portion in contact with the bank 28 was found to have reduced light emission efficiency. Specifically, the inventors found that when film thickness of the portion of the light-emitting layer 25 in contact with the bank 28 was thin, and current flowing therethrough was over approximately 1,000 times current flowing through a flat portion at a center on the anode 23, light emission efficiency was reduced by at least 10%.

Figure 4:
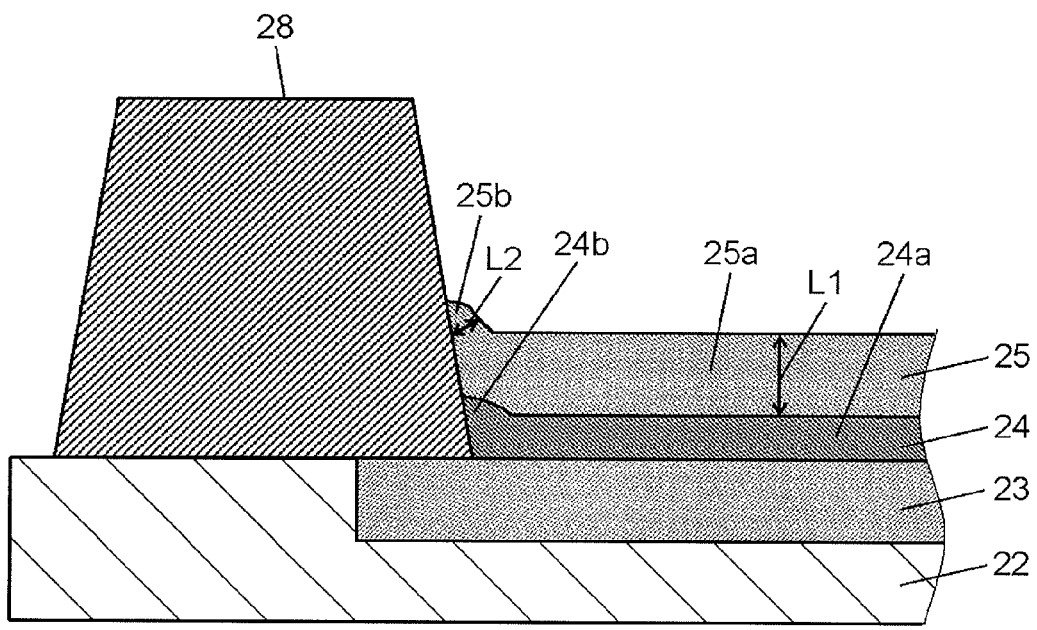
FIG. 4 is a cross-section illustrating an enlargement of elements of a light-emitting layer portion of the EL display device.

FIG. 4 is a cross-section illustrating an enlargement of elements of a light-emitting layer of the EL display device according to the present technology. As illustrated in FIG. 4, a light emitter includes the anode 23, which is an electrode formed to extend into a lower part of the bank 28, the hole transport layer 24 formed on the anode 23 within an area defined by the bank 28, and the light-emitting layer 25 formed on the hole transport layer 24.

As illustrated in FIG. 4, when the hole transport layer 24 is formed within the area defined by the bank 28, the hole transport layer 24 has a main portion 24a formed in contact with the anode 23, and a peripheral protrusion 24b protruding from the main portion 24a and in contact with a side surface of the bank 28. Further, when the light-emitting layer 25 is formed within the area defined by the bank 28, the light-emitting layer 25 has a main portion 25a formed in contact with the hole transport layer 24, and a peripheral protrusion 25b protruding from the main portion 25a and in contact with the side surface of the bank 28.

In this way, the peripheral protrusion 24b of the hole transport layer 24 protrudes from the main portion 24a and is in contact with the side surface of the bank 28. The peripheral protrusion 25b of the light-emitting layer 25 is formed above the peripheral protrusion 24b of the hole transport layer 24 and is in contact with the side surface of the bank 28. In this way, film thickness of the peripheral protrusion 25b of the light-emitting layer 25 can be prevented from becoming thin, and therefore it becomes unlikely that excess current flows through a portion of the light-emitting layer 25 that is in contact with the bank 28, and a decrease in light emission efficiency of each sub-pixel is suppressed.

When the inventors investigated, they found that when an average film thickness L2 of the peripheral protrusion 25b in contact with the side surface of the bank 28 (film thickness in a direction perpendicular to the side surface of the bank 28) was less than 20% of an average film thickness L1 of the main portion 25a of the light-emitting layer 25, excess current easily flowed through the peripheral protrusion 25b.

Table 1 shows that samples were prepared in which the average film thickness L1 of the main portion 25a of the light-emitting layer 25 was 120 nm and 160 nm, and shows results of investigating the average film thickness L2 of the peripheral protrusion 25b through which an excess current exceeding approximately 1000 times normal could flow. Table 1 shows that with respect to samples for which the average film thickness L1 of the main portion 25a of the light-emitting layer 25 was 120 nm, three varieties of sample were fabricated for which the average film thickness L2 of the peripheral protrusion 25b was 18 nm, 24 nm, and 30 nm. With respect to samples for which the average film thickness L1 was 160 nm, three varieties of sample were fabricated for which the average film thickness L2 of the peripheral protrusion 25b was 24 nm, 32 nm, and 40 nm. For each sample, current flowing through the peripheral protrusion 25b of the light-emitting layer 25 was measured, and whether or not an excess current flowed therethrough was evaluated, an excess current being a current exceeding approximately 1,000 times the current flowing through a flat portion at a center of the light-emitting layer 25.

TABLE 1

| Average film thickness L1 | Average film thickness L2 | Excess current |
|---|---|---|
| 120 nm | 18 nm | X |
|  | 24 nm | ○ |
|  | 30 nm | ○ |
| 160 nm | 24 nm | X |
|  | 32 nm | ○ |
|  | 40 nm | ○ |

Excess current:
No excess current ○
Excess current X

As shown in table 1, among samples for which the average film thickness L1 was 120 nm, samples for which the average film thickness L2 was at least 24 nm did not have excess current flowing therethrough, and among samples for which the average film thickness L1 was 160 nm, samples for which the average film thickness L2 was at least 32 nm did not have excess current flowing therethrough. In other words, it was found that when the average film thickness L2 of the peripheral protrusion 25b adjacent to the side surface of the bank 28 was less than 20% of the average film thickness L1 of the main portion 25a of the light-emitting layer 25, excess current flowed easily through the peripheral protrusion 25b.

Accordingly, the average film thickness L2 of the peripheral protrusion 25b in a direction perpendicular to the side surface of the bank 28 is preferably at least 20% of the average film thickness L1 of the main portion 25a.

According to the present technology as described above, the peripheral protrusion 24b of the hole transport layer 24, which is in contact with the side surface of the bank 28, protrudes upwards from the main portion 24a, and the peripheral protrusion 25b of the light-emitting layer 25, which is in contact with the side surface of the bank 28, is formed above the peripheral protrusion 24b of the hole transport layer 24. Thus, a thin film thickness of the peripheral protrusion 25b of the light-emitting layer 25 is prevented, it becomes unlikely that excess current flows through the portion of the light-emitting layer 25 in contact with the bank 28, and a decrease in light emission efficiency is suppressed in each sub-pixel.

Further, by forming the light-emitting layer 25 so that the average film thickness L2 of the peripheral protrusion 25b is at least 20% of the average film thickness L1 of the main portion 25a, occurrence of excess current is suppressed, and a reduction in light emission efficiency of each sub-pixel is further suppressed.

The above describes an embodiment as an example of technology pertaining to the present disclosure. The attached drawings and detailed description are provided for this purpose.

Accordingly, the elements disclosed in the attached drawings and the detailed description include not only elements required to solve the technical problem, but also elements to illustrate the above technology that are not essential to solve the technical problem. Thus, the disclosure in the attached drawings and the detailed description of the elements that are not essential should not be considered to make the elements essential.

Further, the embodiments above are for illustrating the technology of the present disclosure, and therefore various modifications, replacements, additions, omissions, etc., are possible within the scope of the claims or equivalents thereof.

INDUSTRIAL APPLICABILITY

The present technology is applicable to easy implementation of the EL display device having high definition.

REFERENCE SIGNS LIST 1 thin film transistor array
2 anode
3 light-emitting layer
4 cathode
5 pixels
6 pixel circuit
7 gate lines
8 source lines
9 power supply lines
10, 11 thin film transistor
21 base substrate
22 thin film transistor array
23 anode
24 hole transport layer
24a main portion
24b peripheral protrusion
25 light-emitting layer
25a main portion
25b peripheral protrusion
26 electron transport layer
27 cathode
28 bank
29 sealing layer
30 adhesive layer
31 sealing substrate

The invention claimed is:
1. An EL display device, comprising:
a light emitter configured to emit at least red, green, and blue light; and a thin film transistor array configured to control light emission of the light emitter, wherein the light emitter includes light-emitting layers configured to emit at least red, green, and blue light, the light-emitting layers being disposed within areas defined by a bank,
the light emitter further includes electrodes that extend under the bank and hole transport layers that are above the electrodes and within the areas defined by the bank, the light-emitting layers being formed on the hole transport layers,
the hole transport layers each have a peripheral protrusion in contact with a side surface of the bank and a main portion, the peripheral protrusion protruding upwards from the main portion,
for each of the hole transport layers, an average film thickness of a peripheral portion that includes the peripheral protrusion is greater than an average film thickness of the main portion,
the light-emitting layers each have a peripheral protrusion in contact with a side surface of the bank, the peripheral protrusions of the light-emitting layers being formed above corresponding ones of the peripheral protrusions of the hole transport layers, and
an average film thickness of the peripheral protrusion of each of the light-emitting layers is at least 20% of an average film thickness of a main portion of each of the light-emitting layers.

* * * * *